(12) United States Patent
Haider et al.

(10) Patent No.: US 6,605,810 B1
(45) Date of Patent: Aug. 12, 2003

(54) DEVICE FOR CORRECTING THIRD-ORDER SPHERICAL ABERRATION IN A LENS, ESPECIALLY THE OBJECTIVE LENS OF AN ELECTRONIC MICROSCOPE

(76) Inventors: Maximilian Haider, Pfarrgasse 20, D-69251 Gaiberg (DE); Stephan Uhlemann, Rathausstrasse 20, D-69126 Heidelberg (DE)

( * ) Notice: Subject to any disclaimer, the term of this patent is extended or adjusted under 35 U.S.C. 154(b) by 0 days.

(21) Appl. No.: 09/601,053
(22) PCT Filed: Aug. 29, 1998
(86) PCT No.: PCT/DE98/02597
§ 371 (c)(1),
(2), (4) Date: Sep. 5, 2000
(87) PCT Pub. No.: WO99/38188
PCT Pub. Date: Jul. 29, 1999

(30) Foreign Application Priority Data

Jan. 23, 1998 (DE) .......................... 198 02 409

(51) Int. Cl.[7] .............................. H01J 37/10
(52) U.S. Cl. .................. 250/396 R; 250/310
(58) Field of Search .............. 250/396 R, 310, 250/311, 398, 396 ML, 492.2

(56) References Cited

U.S. PATENT DOCUMENTS 4,303,864 A * 12/1981 Crewe et al. ........... 250/396 R
4,962,313 A * 10/1990 Rose ........................ 250/311
5,084,622 A * 1/1992 Rose ...................... 250/396 R

* cited by examiner

Primary Examiner—Kiet T. Nguyen
(74) Attorney, Agent, or Firm—Edwin D. Schindler

(57) ABSTRACT

A device for correcting third-order spherical aberration in the objective lens of an electron microscope, including an objective lens and a correction device which is formed by two hexapoles and a round-lens doublet arranged therebetween having two round lenses with the same focal length, whereby a single round lens (3) is arranged between the objective lens (2) and the correction device (1) in such a way that a parallel optical path hits the correction device (1) and the coma-free plane (6) of the objective lens is represented on the plane of the first hexapole (8) of the correction device (1) or two round lenses with different focal lengths are arranged between the objective lens and the correction device, whereby the distance between the round lens (14) close to the objective and the coma-free plane (16) of the objective and the distance between the round lens (15) close to the correction device and the coma-free plane (17) of the correction device is the same is terms of focal length and the distance between both round lenses (14, 15) is equal to the sum of their focal lengths.

6 Claims, 2 Drawing Sheets

Figure 1:
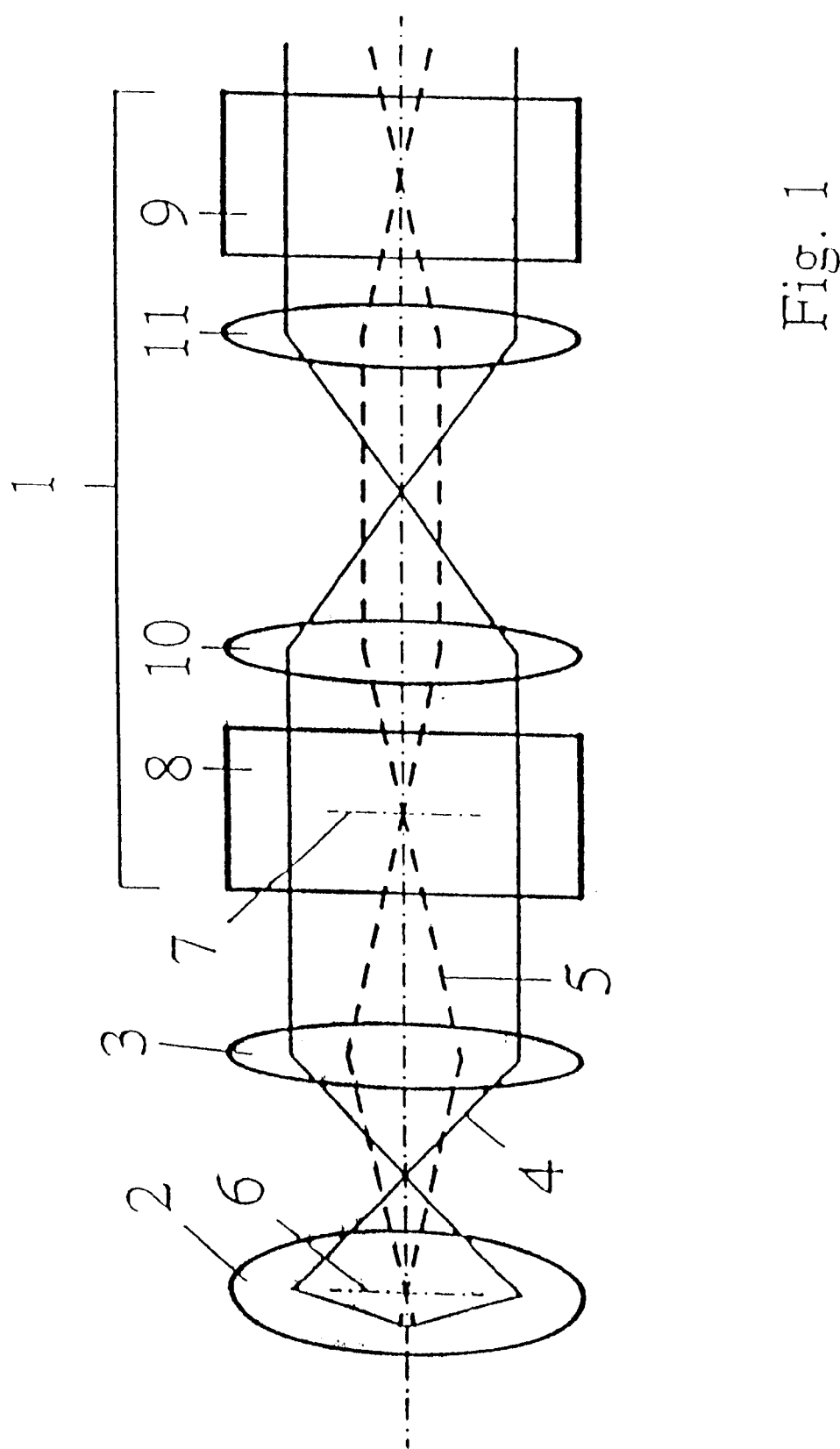

DEVICE FOR CORRECTING THIRD-ORDER SPHERICAL ABERRATION IN A LENS, ESPECIALLY THE OBJECTIVE LENS OF AN ELECTRONIC MICROSCOPE

BACKGROUND OF THE INVENTION

1. Technical Field of the Invention

The invention relates to a device for correcting third-order spherical aberration in a lens, especially the objective lens of an electron microscope, comprising an objective lens and in the direction of the optical path a downstream correction device, which is formed by a first and a second hexapole and a round-lens doublet arranged therebetween comprising two round lenses with the same focal length, whereby the distance between the two lenses is twice their focal length, each being located at the focal point distance from the centre plane of the respective adjacent hexapole.

2. Description of the Prior Art

The term spherical aberration covers all those optical image defects which in the Gaussian dioptrics are determined by the elementary path, which originate from the optical axis in the object plane to be mapped. In high resolution electron optical systems the performance, i.e. the resolving capacity, is limited by the spherical aberration. It is therefore a principle concern in high resolution electron microscopic optics to eliminate this spherical aberration. In the case of round-lens systems with a straight optical axis, the defect is the third-order spherical aberration. As a correction device, the journal 'Nuclear Instruments and Methods Vol. 187, 1981, page 187ff., has already proposed a suitable solution, especially for scanning transmission electron microscopes. Basically, the design comprises two hexapoles, between which there is a located a round-lens system comprising two round lenses with the same focal length, whereby the distance between the lenses is twice their focal length. The two hexapoles are located at the focal point distance from the respectively adjacent round lens so that the centre plane of the first hexapole is imaged on the centre plane of the second hexapole.

European Patent Application No. 0,451,370 proposes a concrete application of this correction device to eliminate the third-order spherical aberration for a round lens serving as an objective, whereby between the correction device described above and the objective lens a further round-lens doublet is situated, which in configuration and arrangement to the entrance side hexapole of the corrector matches the round-lens doublet of the corrector.

It is to be seen as a considerable disadvantage that setting the spherical aberration of the correction device described in the aforementioned printed publication requires appreciable efforts for setting and adjustment. Moreover, the described solution, an achieved optimised corrector configuration can only be used in conjunction with one objective (for which it was optimised).

Adaptation to other objectives (with a different focal length and spherical aberration) is difficult or even impossible and requires changes to be made in the corrector itself.

SUMMARY OF THE INVENTION

On this basis, it is the object of the invention to dispose the correction device described above, in order to eliminate the third-order spherical aberration, in the optical path behind an objective and to enable first simple adjustment to different objectives and second a simple fine adjustment of the spherical aberration.

In order to solve the inventive tasks two solutions are proposed which can be implemented independently of each other.

The first solution described disposes a round lens between the correction device described above and the objective lens. In respect of its strength and position the round-lens is to be configured so that it fulfils two conditions: first it must direct the optical path originating from the objective lens as a parallel optical path onto the entrance of the correction device known per se; therein lies a precondition for the fundamental path originating from the optical axis at the object point. In addition, the round lens has the task of imaging the coma-free plane of the objective lens onto the coma-free planes of the hexapole of the correction device. This yields a precondition for the extra-axial fundamental path, which has a nodal point on the coma-free planes. It follows furthermore from these conditions that the axial fundamental path intersects the optical axis before the round lens so that at a distance close to the front of the round lens a first image is produced. As a delimitation to European Patent Application No. 0,451,370 attention is drawn to the fact that in contrast thereto the first image is positioned in infinity and the use of a further round lens is essential.

The construction of the state of complete correction requires the following steps:

To that end, a correction device is presumed which is permanently and optimally adjusted. Thereafter, the inventive round lens positioned between the objective lens and the corrector is moved along the optical axis to optimise the enlargement and to adjust the path height of the axial fundamental path and its lens strength is adjusted. As a final step, the objective lens is adjusted by altering its strength. Thereby the strength of the alteration of the objective lens is comparatively small and for typical objectives is less than 10%. The adaptation and adjustment of the condition of full correction is thus primarily achieved by arranging and setting the round lens in the specified way. Adjusting the corrective condition does not produce appreciable disadvantages in respect of the coefficients of the image defects. The decisive advantage is to be seen therein that not the corrective device is to be adjusted in accordance with the spherical aberration and the focal length of the objective lenses and the desired residual spherical aberration, which would bring considerable and far-reaching adjustment problems in respect of the number of elements of the correction device to be changed and in respect of the latter's stability. The adjustment proposed by the invention with the aid of the round lens is in contrast thereto implemented simply and unproblematically. In addition to the substantial simplification of adjustment, in respect of the state-of-the-art there is a substantial simplification of the configuration of the apparatus because henceforth only a single round lens is used. This means, for example, that for the spatial accommodation of this round lens, which must be implemented in the objective pole shoe and is thus limited, particularly in radial respect terms sufficient space is available. Moreover, the cooling performance required is substantially reduced.

The aforementioned corrective arrangement has the object of fully eliminating the third-order spherical aberration. To complete the picture, for clarification it is mentioned that in operation, to generate a phase contrast, the spherical aberration is not reduced to zero, but to a value which is more or less 1% to 5% of the original value. This setting of the minor third-order image defect is obtained by adjusting the strength of the round lens and not that of the corrector as is the case of the known solution.

The inventive corrective arrangement is also highly suitable for this purpose.

A further fully independent solution of the task is characterised therein that the focal lengths of the round lenses of the doublet between the objective and the corrector are different, the distance between the round lens close to the objective and the coma-free plane of the objective and the distance between the round lens close to the correction device and the coma-free plane of the correction device is the same in terms of focal length and the distance between both round lenses is equal to the sum of their focal lengths.

In terms of the number of elements used, this solution is identical to that specified by European Patent Application No. 0,451,370 with decisive differences in the spatial arrangement of the two round lenses between the objective lens and the correction device and their focal lengths. Here is expressly required, and deviating from the solution proposed there, that the two round lenses have different focal lengths and the spatial arrangement is implemented in such as way that the distance between the round lens close to the objective and the coma-free plane of the objective and the distance between the second round lens close to the correction device and the coma-free plane of the correction device and the coma-free plane of the entrance side hexapole is the same in terms of focal length. In addition, the distance between both round lenses is equal to the sum of both focal lengths. In the borderline case of the identicalness of the two focal lengths the last requirement merges into the requirement in accordance with European Patent Application No. 0,451,370.

The adjustment of the correction device to a given objective lens is achieved in way similar to the described solution. Starting from an optimised correction device, that is, one set to a fixed value, the arrangement comprising two round lenses is placed between the objective lens and the correction device. By determining the refractive power and the position of the two round lenses one obtains an adjustment to the objective lens. This means that not only the correction of a spherical aberration of a specific value is possible for an objective lens, but the correction of the spherical aberration can also be influenced to the affect that one and the same correction device can compensate the different values of spherical aberrations of different objective lenses. Advantageously, an adjustment of the correction device to the respective value of the spherical aberration of the objective lens is not essential. A design adaptation of the correction device to the respective objective lens is thus not necessary because the adjustment is attained via the setting and the suitable positioning of the round lenses. Here, too, adjustment of the correction device pre-set to optimum conditions for the respective objective lens with its respective spherical aberration value is implemented by setting and the suitable positioning of the two round lenses disposed therebetween.

In contrast to the aforesaid alternative situation, there are constructional disadvantages owing to the integration of two round lenses in a specific volume, the need for a higher cooling performance as well as a complicated configuration as is the case in the known solution.

In a further embodiment it is proposed to select the focal length of the round lens close to the correction device so that is less than the focal length of the round lens close to the objective. With a such an arrangement one obtains a decrease in the corrective effect of the spherical aberration.

In the opposite case of a higher focal length of the round lens close to the correction device one obtains an increase in the correction effect.

BRIEF DESCRIPTION OF THE DRAWING FIGURE

Further details, features and advantages can be taken from the following description part in which with the aid of the drawing a typical embodiment of the invention is given in a diagrammatic representation. It shows:

DETAILED DESCRIPTION OF THE DRAWING AND PREFERRED EMBODIMENTS

Figure 2:
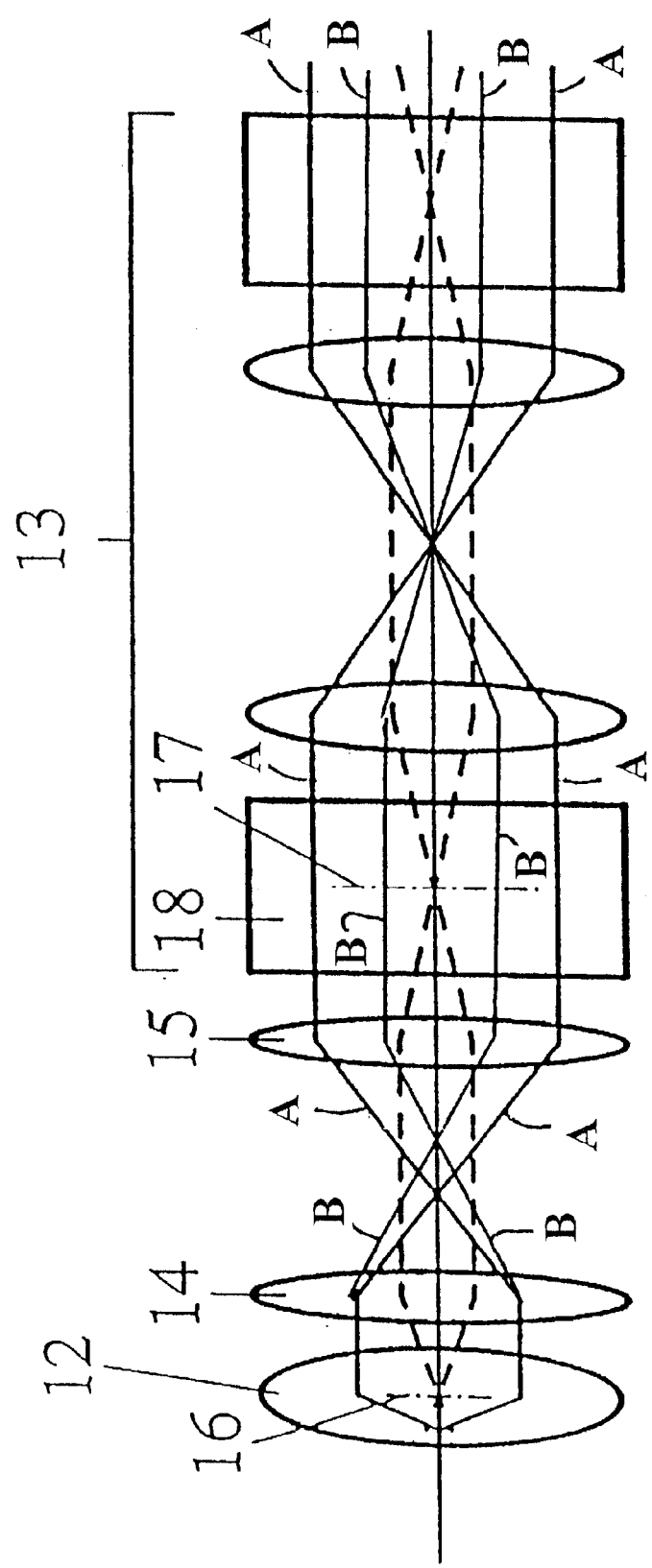

FIG. 1: the optical path of a corrective arrangement where a single round lens is disposed between the objective lens and the correction device FIG. 2: an arrangement where two round lenses with differing focal lengths are disposed between the objective lens and the correction device.

FIG. 1 shows the optical path of the two fundamental solutions of the Gaussian dioptrics in the individual optical elements of the corrective arrangements, comprising a correction device (1), an objective lens (2) and a round lens (3) located therebetween. The fundamental path originating from the optical axis is designated by (4) and the extra-axial fundamental path by (5). The coma-free plane (6) of the objective lens (2) is described by the nodal point of the extra-axial path (5). The round lens (3) is disposed so that the path (5) is refracted in such a way that the next nodal point comes to lie on the coma-free plane (7) of the first hexapole of the correction device (1). The axial path (4) pierces the optical axis where a first image is produced and is directed parallel by the round lens (3) to the correction device. Its path height can be influenced by moving the round lens (3) in the direction of the optical axis.

During the operation of the total system, the fine adjustment of the spherical aberration can be effected later through suitable variation of the strengths of the lenses (2) and (3).

The correction device itself comprises, as is known per se, two outside lying hexapoles (8, 9) and a round-lens doublet disposed therebetween, consisting of two round lenses (10, 11) with the same focal length whose distance apart corresponds to double the focal length. The distance between the round lens and its adjacent hexapole is also equal to the focal length. This correction device known per se serves to eliminate the third-order spherical aberration.

FIG. 2 also describes the optical path between the objective lens (12) and the correction device (13) in detail using the fundamental paths of Gaussian dioptrics, whereby the correction device (13) is identical to the correction device (1) described above so that to avoid repetition it is not described again.

In contrast thereto, between the objective lens (12) and the correction device (13), there are now located two round lenses (14, 15) of respectively different refractive power. The arrangement is composed in that the first round lens (14) is disposed at a distance to the coma-free plane (16) of the objective lens (12) which is equal to its focal length. The second round lens (15) is on the one hand disposed at a distance equal to the sum of the focal lengths of the two round lenses (14, 15) to the round lens (14) on the objective side and on the other hand at the distance of its focal length to the coma-free plane (17) of first hexapole (18) at the distance of its focal length. For a pre-set correction device, adjustment is effected via setting the refractive power and defining the position of the two round lenses (14, 15) in relation to the respective objective lens (12). While retaining the setting of the correction device, adjustment is made to the respective values of the spherical aberration of the respective objective lens (12) so that it is possible to use one and the same correction device (13) for objectives with different values for focal length and spherical aberration.

In FIG. 2, path "A" shows the focal length of the second round lens (15) as being greater than the focal length of the first round lens (14) for increasing the correction effect of the correction device (13), while path "B" shows the focal length of the first round lens (14) as being greater than the focal length of the second round lens (15) for reducing the correction effect of the correction device As a result both figures show solutions by means of which with minor adjustment work a pre-set and optimised correction device can be adjusted to the respective objective lenses, whereby with the aid of round lenses the desired residual spherical aberration can be set.

What is claimed is:

1. An apparatus for correcting a third-order spherical aberration in a lens, comprising:

an objective lens;

a correction device positioned in a downstream direction of a propagation of optical rays, said correction device comprising a first hexapole and a second hexapole with a round-lens doublet being arranged between said first hexapole and said second hexapole, said round-lens doublet comprising a first round lens and a second round lens of equal focal lengths, with said first round lens and said second round lens positioned with a distance between one another equal to two focal lengths of said equal focal lengths, said first round lens being a distance of one said focal length from said first hexapole and said second round lens being a distance of one said focal, length from said second hexapole; and, an additional single round-lens positioned between said objective lens and said corrective device, so that a parallel downstream path of optical rays strikes said correction device with an aberration-free plane of said objective lens being represented on an aberration-free plane of said first hexapole of said correction device.

2. The apparatus for correcting a third-order spherical aberration in a lens according to claim 1, wherein said objective lens is an objective lens of an electron microscope.

3. An apparatus for correcting a third-order spherical aberration in a lens, comprising:

an objective lens;

a correction device positioned in a downstream direction of a propagation of optical rays, said correction device comprising a first hexapole and a second hexapole with a round-lens doublet being arranged between said first hexapole and said second hexapole, said round-lens doublet comprising a first round lens and a second round lens of equal focal lengths, with said first round lens and said second round lens positioned with a distance between one another equal to two focal lengths of said equal focal lengths, said first round lens being a distance of one said focal length from a center plane of said first hexapole and said second round lens being a distance of one said focal length from a center plane of said second hexapole; and, a third round lens and a fourth round lens positioned between said objective lens and said correction device with said third round lens having a different focal length than it said fourth round lens, said third round lens being closer to said objective lens than said fourth round lens and said fourth round lens being closer to said correction device than said third round lens, with a distance between said third round lens and an aberration-free plane of said objective lens being equal to a focal length of said third round lens, a distance between said fourth round lens and an aberration-free plane of said correction device being equal to a focal length of said fourth round lens, and a distance between said third round lens and said fourth round lens being equal to a sum of said focal length of said third round lens plus said focal length of said fourth round lens.

4. The apparatus for correcting a third-order spherical aberration in a lens according to claim 3, wherein said objective lens is an objective lens of an electron microscope.

5. The apparatus for correcting a third-order spherical aberration in a lens according to claim 3, wherein said focal length of said third round lens is greater than said focal length of said fourth round lens for reducing a correction effect of said correction device.

6. The apparatus for correcting a third-order spherical aberration in a lens according to claim 3, wherein said focal length of said fourth round lens is greater than said focal length of said third round lens for increasing a correction effect of said correction device.

* * * * *